US00RE40531E

(19) United States
(12) Reissued Patent
Graff et al.

(10) Patent Number: US RE40,531 E
(45) **Date of Reissued Patent: *Oct. 7, 2008**

(54) ULTRABARRIER SUBSTRATES

(75) Inventors: Gordon Lee Graff, West Richland, WA (US); Mark Edward Gross, Pasco, WA (US); Ming Kun Shi, Pleasanton, CA (US); Michael Gene Hall, West Richland, WA (US); Peter Maclyn Martin, Kennewick, WA (US); Eric Sidney Mast, Richland, WA (US)

(73) Assignee: Battelle Memorial Institute, Columbus, OH (US)

( * ) Notice: This patent is subject to a terminal disclaimer.

(21) Appl. No.: 10/890,437

(22) Filed: Jul. 12, 2004

Related U.S. Patent Documents

Reissue of:
(64) Patent No.: 6,413,645
Issued: Jul. 2, 2002
Appl. No.: 09/553,188
Filed: Apr. 20, 2000

U.S. Applications:
(63) Continuation-in-part of application No. 09/427,138, filed on Oct. 25, 1999, now Pat. No. 6,522,067.

(51) Int. Cl.
*B32B 15/04* (2006.01)

(52) U.S. Cl. ..... 428/446; 428/457; 428/469; 428/688; 428/500; 428/411.1; 428/690; 426/126

(58) Field of Classification Search ..... 428/446, 428/457, 469, 688, 500, 690, 411.1; 426/126
See application file for complete search history.

(56) References Cited

U.S. PATENT DOCUMENTS

| | | | | |
|---|---|---|---|---|
| 2,382,432 | A | | 8/1945 | McManus et al. |
| 2,384,500 | A | | 9/1945 | Stoll |
| 3,475,307 | A | * | 10/1969 | Teumer et al. ..... 204/168 |
| 3,607,365 | A | * | 9/1971 | Lindlof ..... 427/213 |
| 3,941,630 | A | * | 3/1976 | Larrabee ..... 438/75 |
| 4,061,835 | A | | 12/1977 | Poppe et al. |
| 4,098,965 | A | * | 7/1978 | Kinsman ..... 429/153 |
| 4,266,223 | A | | 5/1981 | Frame |
| 4,283,482 | A | * | 8/1981 | Hattori et al. ..... 430/296 |
| 4,313,254 | A | | 2/1982 | Feldman et al. |
| 4,426,275 | A | | 1/1984 | Meckel et al. |
| 4,521,458 | A | | 6/1985 | Nelson |
| 4,537,814 | A | | 8/1985 | Itoh et al. |
| 4,555,274 | A | | 11/1985 | Kitajima et al. |
| 4,557,978 | A | | 12/1985 | Mason |
| 4,572,842 | A | | 2/1986 | Dietrich et al. |
| 4,581,337 | A | * | 4/1986 | Frey et al. ..... 436/533 |
| 4,624,867 | A | * | 11/1986 | Iijima et al. ..... 427/255.6 |
| 4,695,618 | A | * | 9/1987 | Mowrer ..... 528/55 |
| 4,710,426 | A | | 12/1987 | Stephens |
| 4,722,515 | A | | 2/1988 | Ham |
| 4,768,666 | A | | 9/1988 | Kessler |
| 4,842,893 | A | * | 6/1989 | Yializis et al. ..... 427/497 |

(Continued)

FOREIGN PATENT DOCUMENTS

| | | | | |
|---|---|---|---|---|
| BE | 704297 | | | 2/1968 |
| BE | 704 297 | | * | 2/1968 |
| CA | 2353506 | A1 | | 5/2000 |
| DE | 196 03 746 | A1 | | 4/1997 |
| DE | 19603746 | | * | 4/1997 |
| DE | 696 15 510 | T2 | | 5/2002 |
| EP | 0 147 696 | B1 | | 7/1985 |
| EP | 0 299 753 | | * | 1/1989 |
| EP | 0 299 753 | A2 | | 1/1989 |
| EP | 0 340 935 | A2 | | 11/1989 |
| EP | 0 340 935 | | * | 11/1989 |
| EP | 0 390 540 | B1 | | 3/1990 |
| EP | 0 390 540 | | * | 10/1990 |
| EP | 0 468 440 | A2 | | 1/1992 |
| EP | 0 547 550 | A1 | | 6/1993 |
| EP | 0 547 550 | | * | 6/1993 |
| EP | 0 590 467 | A1 | | 4/1994 |
| EP | 0 590 467 | | * | 4/1994 |
| EP | 0 722 787 | | * | 7/1996 |
| EP | 0 722 787 | A2 | | 7/1996 |
| EP | 0 777 280 | B1 | | 6/1997 |
| EP | 0 777 280 | A2 | | 6/1997 |
| EP | 0 777 281 | A2 | | 6/1997 |
| EP | 0 787 824 | A2 | | 8/1997 |

(Continued)

OTHER PUBLICATIONS

Inoue et al., Proc. Jpn. Congr. Mater. Res., vol. 33, p. 177–9, 1990.*

Affinito, J.F., et al., "Vacuum Deposition of Polymer Electrolytes On Flexible Substrates", "Proceedings of the Ninth International Conference on Vacuum Web Coating", Nov. 1995 ed R. Bakish, Bakish Press 1995, pp. 20–36.*

Penning, F.M., Electrical Discharges in Gasses, Gordon and Breach Science Publishers, 1965, Chapters 5–6, pp. 19–35, and Chapter 8, pp. 41–50.*

Akedo et al., "LP–5: Lake–News Poster: Plasma–CVD SiNx/Plasma–Polymerized CNx:H Multi–layer Passivation Films for Organic Light Emmitting Diods", SID 03 Digest.

Chwang et al., "Thin Film encapsulated flexible organic electroluminescent displays", American Institute of Physics, 2003.

Wong, C.P., "Recent Advances in IC Passivation and Encapsulation: Process Techniques and Materials," Polymers for Electronic and Photonic Applications, AT&T Bell Laboratories, 1993, pp. 167–209.

(Continued)

*Primary Examiner*—Kuo-Liang Peng
(74) *Attorney, Agent, or Firm*—Dinsmore & Shohl LLP

(57) ABSTRACT

A barrier assembly. The barrier assembly includes at least one barrier stack having at least one barrier layer and at least one polymer layer. The barrier stack has an oxygen transmission rate of less than 0.005 cc/m$^2$/day at 23° C. and 0% relative humidity, and an oxygen transmission rate of less than 0.005 cc/m$^2$/day at 38° C. and 90% relative humidity. The barrier stack also has a water vapor transmission rate of less than 0.005 g/m$^2$/day at 38° C. and 100% relative humidity. A method for making a barrier assembly is also disclosed.

25 Claims, 1 Drawing Sheet

U.S. PATENT DOCUMENTS

| | | | | | |
|---|---|---|---|---|---|
| 4,843,036 | A | | 6/1989 | Schmidt et al. | |
| 4,855,186 | A | | 8/1989 | Grolig et al. | |
| 4,889,609 | A | | 12/1989 | Cannella | |
| 4,913,090 | A | | 4/1990 | Harada et al. | |
| 4,931,158 | A | | 6/1990 | Bunshah et al. | |
| 4,934,315 | A | | 6/1990 | Linnebach et al. | |
| 4,954,371 | A | * | 9/1990 | Yializis | 427/497 |
| 4,977,013 | A | | 12/1990 | Ritchie et al. | |
| 5,032,461 | A | * | 7/1991 | Shaw et al. | 428/461 |
| 5,036,249 | A | * | 7/1991 | Pike-Biegunski et al. | 313/509 |
| 5,047,131 | A | | 9/1991 | Wolfe et al. | |
| 5,059,861 | A | | 10/1991 | Littman et al. | |
| 5,124,204 | A | * | 6/1992 | Yamashita et al. | 428/331 |
| 5,189,405 | A | * | 2/1993 | Yamashita et al. | 313/512 |
| 5,203,898 | A | | 4/1993 | Carpenter et al. | |
| 5,204,314 | A | | 4/1993 | Kirlin et al. | |
| 5,237,439 | A | * | 8/1993 | Misono et al. | 349/122 |
| 5,260,095 | A | * | 11/1993 | Affinito | 427/124 |
| 5,336,324 | A | | 8/1994 | Stall et al. | |
| 5,354,497 | A | * | 10/1994 | Fukuchi et al. | 252/299.01 |
| 5,356,947 | A | | 10/1994 | Ali et al. | |
| 5,393,607 | A | | 2/1995 | Kawasaki et al. | |
| 5,395,644 | A | * | 3/1995 | Affinito | 427/124 |
| 5,402,314 | A | | 3/1995 | Amago et al. | |
| 5,427,638 | A | * | 6/1995 | Goetz et al. | 156/153 |
| 5,440,446 | A | * | 8/1995 | Shaw et al. | 361/301.5 |
| 5,451,449 | A | | 9/1995 | Shetty et al. | |
| 5,461,545 | A | | 10/1995 | Leroy et al. | |
| 5,464,667 | A | | 11/1995 | Kohler et al. | |
| 5,510,173 | A | | 4/1996 | Pass et al. | |
| 5,512,320 | A | | 4/1996 | Turner et al. | |
| 5,536,323 | A | * | 7/1996 | Kirlin et al. | 118/726 |
| 5,547,508 | A | * | 8/1996 | Affinito | 118/50 |
| 5,554,220 | A | * | 9/1996 | Forrest et al. | 117/88 |
| 5,576,101 | A | * | 11/1996 | Saitoh et al. | 428/332 |
| 5,578,141 | A | | 11/1996 | Mori et al. | |
| 5,607,789 | A | * | 3/1997 | Treger et al. | 429/90 |
| 5,620,524 | A | * | 4/1997 | Fan et al. | 118/726 |
| 5,629,389 | A | * | 5/1997 | Roitman et al. | 525/534 |
| 5,652,192 | A | | 7/1997 | Matson et al. | |
| 5,654,084 | A | * | 8/1997 | Egert | 428/215 |
| 5,660,961 | A | | 8/1997 | Yu | |
| 5,665,280 | A | | 9/1997 | Tropsha | |
| 5,681,615 | A | * | 10/1997 | Affinito et al. | 427/255.6 |
| 5,681,666 | A | * | 10/1997 | Treger et al. | 429/90 |
| 5,684,084 | A | * | 11/1997 | Lewin et al. | 524/590 |
| 5,686,360 | A | * | 11/1997 | Harvey et al. | 438/28 |
| 5,693,956 | A | * | 12/1997 | Shi et al. | 257/40 |
| 5,695,564 | A | | 12/1997 | Imahashi | |
| 5,711,816 | A | * | 1/1998 | Kirlin et al. | 118/726 |
| 5,725,909 | A | | 3/1998 | Shaw et al. | |
| 5,731,661 | A | * | 3/1998 | So et al. | 313/504 |
| 5,736,207 | A | | 4/1998 | Walther et al. | |
| 5,747,182 | A | * | 5/1998 | Friend et al. | 428/690 |
| 5,757,126 | A | * | 5/1998 | Harvey et al. | 313/506 |
| 5,759,329 | A | * | 6/1998 | Krause et al. | 156/244.13 |
| 5,771,177 | A | | 6/1998 | Tada et al. | |
| 5,771,562 | A | * | 6/1998 | Harvey, III et al. | |
| 5,782,355 | A | | 7/1998 | Katagiri et al. | |
| 5,792,550 | A | * | 8/1998 | Phillips et al. | |
| 5,795,399 | A | | 8/1998 | Hasegawa et al. | |
| 5,811,177 | A | * | 9/1998 | Shi et al. | |
| 5,811,183 | A | * | 9/1998 | Shaw et al. | |
| 5,821,692 | A | * | 10/1998 | Rogers et al. | |
| 5,844,363 | A | * | 12/1998 | Gu et al. | |
| 5,869,791 | A | | 2/1999 | Young | |
| 5,872,355 | A | * | 2/1999 | Hueschen | |
| 5,891,554 | A | | 4/1999 | Hosokawa et al. | |
| 5,895,228 | A | | 4/1999 | Biebuyck et al. | |
| 5,902,641 | A | * | 5/1999 | Affinito et al. | |
| 5,902,688 | A | * | 5/1999 | Antoniadis et al. | |
| 5,904,958 | A | * | 5/1999 | Dick et al. | |
| 5,912,069 | A | * | 6/1999 | Yializis et al. | |
| 5,919,328 | A | | 7/1999 | Tropsha et al. | |
| 5,920,080 | A | | 7/1999 | Jones | |
| 5,922,161 | A | * | 7/1999 | Wu et al. | |
| 5,929,562 | A | | 7/1999 | Pichler | |
| 5,934,856 | A | | 8/1999 | Asakawa et al. | |
| 5,945,174 | A | * | 8/1999 | Shaw et al. | |
| 5,948,552 | A | * | 9/1999 | Antoniadis et al. | |
| 5,952,778 | A | * | 9/1999 | Haskal et al. | |
| 5,955,161 | A | | 9/1999 | Tropsha | |
| 5,965,907 | A | * | 10/1999 | Huang et al. | |
| 5,968,620 | A | | 10/1999 | Harvey et al. | |
| 5,994,174 | A | | 11/1999 | Carey et al. | |
| 5,996,498 | A | * | 12/1999 | Lewis | |
| 6,013,337 | A | | 1/2000 | Knors | |
| 6,040,017 | A | | 3/2000 | Mikhael et al. | |
| 6,045,864 | A | * | 4/2000 | Lyons et al. | |
| 6,066,826 | A | | 5/2000 | Yializis | |
| 6,083,313 | A | | 7/2000 | Venkatraman et al. | |
| 6,083,628 | A | * | 7/2000 | Yializis | |
| 6,084,702 | A | | 7/2000 | Byker et al. | |
| 6,087,007 | A | | 7/2000 | Fujii et al. | |
| 6,092,269 | A | | 7/2000 | Yializis et al. | |
| 6,106,627 | A | | 8/2000 | Yializis et al. | |
| 6,117,266 | A | | 9/2000 | Horzel et al. | |
| 6,118,218 | A | | 9/2000 | Yializis et al. | |
| 6,137,221 | A | | 10/2000 | Roitman et al. | |
| 6,146,225 | A | * | 11/2000 | Sheets et al. | |
| 6,146,462 | A | | 11/2000 | Yializis et al. | |
| 6,150,187 | A | | 11/2000 | Zyung et al. | |
| 6,165,566 | A | | 12/2000 | Tropsha | |
| 6,178,082 | B1 | * | 1/2001 | Farooq et al. | |
| 6,195,142 | B1 | | 2/2001 | Gyotoku et al. | |
| 6,198,217 | B1 | | 3/2001 | Suzuki et al. | |
| 6,198,220 | B1 | | 3/2001 | Jones et al. | |
| 6,203,898 | B1 | | 3/2001 | Kohler et al. | |
| 6,207,238 | B1 | | 3/2001 | Affinito | |
| 6,207,239 | B1 | | 3/2001 | Affinito | |
| 6,214,422 | B1 | | 4/2001 | Yializis | |
| 6,217,947 | B1 | | 4/2001 | Affinito | |
| 6,224,948 | B1 | | 5/2001 | Affinito | |
| 6,228,434 | B1 | | 5/2001 | Affinito | |
| 6,228,436 | B1 | | 5/2001 | Affinito | |
| 6,231,939 | B1 | | 5/2001 | Shaw et al. | |
| 6,264,747 | B1 | | 7/2001 | Shaw et al. | |
| 6,268,695 | B1 | | 7/2001 | Affinito | |
| 6,274,204 | B1 | | 8/2001 | Affinito | |
| 6,322,860 | B1 | | 11/2001 | Stein et al. | |
| 6,333,065 | B1 | | 12/2001 | Arai et al. | |
| 6,348,237 | B2 | | 2/2002 | Kohler et al. | |
| 6,350,034 | B1 | | 2/2002 | Fleming et al. | |
| 6,352,777 | B1 | | 3/2002 | Bulovic et al. | |
| 6,358,570 | B1 | | 3/2002 | Affinito | |
| 6,361,885 | B1 | | 3/2002 | Chou | |
| 6,387,732 | B1 | | 5/2002 | Akram | |
| 6,397,776 | B1 | | 6/2002 | Yang et al. | |
| 6,413,645 | B1 | | 7/2002 | Graff et al. | |
| 6,416,872 | B1 | | 7/2002 | Maschwitz | |
| 6,420,003 | B2 | | 7/2002 | Shaw et al. | |
| 6,436,544 | B1 | | 8/2002 | Veyrat et al. | |
| 6,460,369 | B2 | | 10/2002 | Hosokawa | |
| 6,465,953 | B1 | | 10/2002 | Duggal | |
| 6,468,595 | B1 | | 10/2002 | Mikhael et al. | |
| 6,469,437 | B1 | | 10/2002 | Parthasarathy et al. | |
| 6,492,026 | B1 | * | 12/2002 | Graff et al. | 428/411.1 |
| 6,497,598 | B2 | | 12/2002 | Affinito | |
| 6,497,924 | B2 | | 12/2002 | Affinito et al. | |
| 6,509,065 | B2 | | 1/2003 | Affinito | |
| 6,512,561 | B1 | | 1/2003 | Terashita et al. | |

6,522,067 B1 2/2003 Graff et al.
6,537,688 B2 3/2003 Silvernail et al.
6,544,600 B2 4/2003 Affinito et al.
6,548,912 B1 * 4/2003 Graff et al. ..... 257/787
6,569,515 B2 5/2003 Hebrink et al.
6,570,325 B2 * 5/2003 Graff et al. ..... 313/506
6,573,652 B1 * 6/2003 Graff et al. ..... 313/512
6,576,351 B2 6/2003 Silvernail
6,592,969 B1 7/2003 Burroughes et al.
6,597,111 B2 7/2003 Silvernail et al.
6,613,395 B2 9/2003 Affinito et al.
6,614,057 B2 9/2003 Silvernail et al.
6,624,568 B2 9/2003 Silvernail
6,627,267 B2 9/2003 Affinito
6,628,071 B1 9/2003 Su
6,653,780 B2 11/2003 Sugimoto et al.
6,656,537 B2 12/2003 Affinito et al.
6,664,137 B2 12/2003 Weaver
6,681,716 B2 1/2004 Schaepkens
6,720,203 B2 * 4/2004 Carcia et al. ..... 438/99
6,734,625 B2 5/2004 Vong et al.
6,743,524 B2 6/2004 Schaepkens
6,749,940 B1 6/2004 Terasaki et al.
6,765,351 B2 7/2004 Forrest et al.
6,811,829 B2 11/2004 Affinito et al.
6,815,887 B2 11/2004 Lee et al.
6,818,291 B2 11/2004 Funkenbusch et al.
6,835,950 B2 12/2004 Brown et al.
6,836,070 B2 12/2004 Chung et al.
6,837,950 B1 1/2005 Berard
6,864,629 B2 3/2005 Miyaguchi et al.
6,866,901 B2 3/2005 Burrows et al.
6,867,539 B1 3/2005 McCormick et al.
6,872,114 B2 3/2005 Chung et al.
6,872,248 B2 3/2005 Mizutani et al.
6,872,428 B2 3/2005 Yang et al.
6,878,467 B2 4/2005 Chung et al.
6,888,305 B2 5/2005 Weaver
6,888,307 B2 5/2005 Silvernail et al.
6,891,330 B2 5/2005 Duggal et al.
6,897,474 B2 5/2005 Brown et al.
6,897,607 B2 5/2005 Sugimoto et al.
6,905,769 B2 6/2005 Komada
6,923,702 B2 * 8/2005 Graff et al. ..... 445/24
6,936,131 B2 8/2005 McCormick et al.
6,975,067 B2 12/2005 McCormick et al.
6,994,933 B1 2/2006 Bates
6,998,648 B2 2/2006 Silvernail
7,002,294 B2 2/2006 Forrest et al.
7,012,363 B2 3/2006 Weaver et al.
7,015,640 B2 3/2006 Schaepkens et al.
7,018,713 B2 3/2006 Padiyath et al.
7,029,765 B2 4/2006 Kwong et al.
7,033,850 B2 4/2006 Tyan et al.
7,056,584 B2 6/2006 Iacovangelo
7,086,918 B2 8/2006 Hsiao et al.
7,156,942 B2 1/2007 McCormick et al.
7,183,197 B2 2/2007 Won et al.
2001/0015074 A1 8/2001 Hosokawa
2001/0015620 A1 8/2001 Affinito
2002/0022156 A1 2/2002 Bright
2002/0025444 A1 2/2002 Hebgrink et al.
2002/0068143 A1 6/2002 Silvernail
2002/0069826 A1 6/2002 Hunt et al.
2002/0102363 A1 8/2002 Affinitio et al.
2002/0102818 A1 8/2002 Sandhu et al.
2002/0125822 A1 9/2002 Graff et al.
2002/0139303 A1 10/2002 Yamazaki et al.
2002/0140347 A1 10/2002 Weaver
2003/0038590 A1 2/2003 Silvernail et al.
2003/0085652 A1 5/2003 Weaver
2003/0098647 A1 5/2003 Silvernail et al.
2003/0124392 A1 7/2003 Bright
2003/0127973 A1 7/2003 Weaver et al.
2003/0184222 A1 10/2003 Nilsson
2003/0197197 A1 10/2003 Brown et al.
2003/0218422 A1 11/2003 Park et al.
2003/0235648 A1 12/2003 Affinito et al.
2004/0029334 A1 2/2004 Bijker et al.
2004/0046497 A1 3/2004 Schaepkens et al.
2004/0071971 A1 4/2004 Lacovangelo
2004/0113542 A1 6/2004 Hsiao et al.
2004/0115402 A1 6/2004 Schaepkens
2004/0115859 A1 6/2004 Murayama et al.
2004/0119028 A1 6/2004 McCormick et al.
2004/0175512 A1 9/2004 Schaepkens
2004/0175580 A1 9/2004 Schaepkens
2004/0209090 A1 10/2004 Iwanaga
2004/0219380 A1 11/2004 Naruse et al.
2004/0229051 A1 11/2004 Schaepkens et al.
2004/0241454 A1 12/2004 Shaw et al.
2004/0263038 A1 12/2004 Ribolzi et al.
2005/0003098 A1 1/2005 Kohler et al.
2005/0006786 A1 1/2005 Sawada
2005/0051094 A1 3/2005 Schaepkens et al.
2005/0079295 A1 4/2005 Schaepkens
2005/0079380 A1 4/2005 Iwanaga
2005/0093001 A1 5/2005 Liu et al.
2005/0093437 A1 5/2005 Ouyang
2005/0094394 A1 5/2005 Padiyath et al.
2005/0095736 A1 5/2005 Padiyath et al.
2005/0112378 A1 5/2005 Naruse et al.
2005/0122039 A1 6/2005 Satani
2005/0129841 A1 6/2005 McCormick et al.
2005/0133781 A1 6/2005 Yan et al.
2005/0140291 A1 6/2005 Hirakata et al.
2005/0146267 A1 7/2005 Lee et al.
2005/0174045 A1 8/2005 Lee et al.
2005/0212419 A1 9/2005 Vazan et al.
2005/0238846 A1 10/2005 Arakatsu et al.
2006/0003474 A1 1/2006 Tyan et al.
2006/0028128 A1 2/2006 Ohkubo
2006/0061272 A1 3/2006 McCormick et al.
2006/0062937 A1 3/2006 Padiyath et al.
2006/0063015 A1 3/2006 McCormick et al.
2006/0246811 A1 11/2006 Winters et al.
2006/0250084 A1 11/2006 Cok et al.
2007/0009674 A1 1/2007 Okubo et al.

FOREIGN PATENT DOCUMENTS

EP 0 787 826 A1 8/1997
EP 0 787 826 * 8/1997
EP 0 915 105 A1 5/1999
EP 0 916 394 * 5/1999
EP 0 916 394 A2 5/1999
EP 0 931 850 * 7/1999
EP 0 931 850 A1 7/1999
EP 0 977 469 * 2/2000
EP 0 977 469 A2 2/2000
EP 1 021 070 A1 7/2000
EP 1127 381 A1 8/2001
EP 1 130 420 A2 9/2001
EP 1 278 244 A2 1/2003
EP 1 514 317 A1 3/2005
JP S63-96895 4/1988
JP 63136316 * 6/1988
JP 63136316 8/1988
JP 64-18441 1/1989
JP S64-41192 2/1989
JP 2-183230 7/1990
JP 3-290375 12/1991
JP 4-48515 2/1992

| | | | |
|---|---|---|---|
| JP | 4-14440 | | 4/1992 |
| JP | H4-267097 | | 9/1992 |
| JP | H5-182759 | | 7/1993 |
| JP | 06-136159 | | 5/1994 |
| JP | 06158305 | | 6/1994 |
| JP | 61-79644 | | 6/1994 |
| JP | 6-234186 | | 8/1994 |
| JP | 07-074378 | | 3/1995 |
| JP | H07-147189 | | 6/1995 |
| JP | H7-192866 | | 7/1995 |
| JP | 8-72188 | | 3/1996 |
| JP | H8-171988 | | 7/1996 |
| JP | 8-179292 | | 7/1996 |
| JP | 08325713 | | 10/1996 |
| JP | 08325713 | * | 12/1996 |
| JP | 09059763 | | 4/1997 |
| JP | H9-132774 | | 5/1997 |
| JP | 09-161967 | | 6/1997 |
| JP | 09-232553 | | 9/1997 |
| JP | 10-013083 | | 1/1998 |
| JP | H10-41067 | | 2/1998 |
| JP | 11-017106 | | 1/1999 |
| JP | 11-040344 | | 2/1999 |
| JP | 11-255928 | | 9/1999 |
| JP | 2000-058258 | | 2/2000 |
| JP | 2002/505969 | | 2/2002 |
| JP | 10312883 | | 3/2002 |
| JP | 3579556 | B2 | 10/2004 |
| JP | 2006-294780 | | 10/2006 |
| WO | WO 87/07848 | | 12/1987 |
| WO | WO 98/00337 | | 1/1989 |
| WO | WO 95/10117 | | 4/1995 |
| WO | WO 96/23217 | | 8/1996 |
| WO | WO 97/04885 | | 2/1997 |
| WO | WO 97/16053 | | 5/1997 |
| WO | WO 97/22631 | | 6/1997 |
| WO | WO 98/10116 | | 3/1998 |
| WO | WO 98/18852 | | 5/1998 |
| WO | WO 99/16557 | | 4/1999 |
| WO | WO 99/16931 | | 4/1999 |
| WO | WO 99/46120 | | 9/1999 |
| WO | WO 00/26973 | | 5/2000 |
| WO | WO 00/35603 | | 6/2000 |
| WO | WO 00/35604 | | 6/2000 |
| WO | WO 00/35993 | | 6/2000 |
| WO | WO 00/36661 | | 6/2000 |
| WO | WO 00/36665 | | 6/2000 |
| WO | WO 01/68360 | A1 | 9/2001 |
| WO | WO 01/81649 | A1 | 11/2001 |
| WO | WO 01/82336 | A2 | 11/2001 |
| WO | WO 01/82389 | A1 | 11/2001 |
| WO | WO 01/87825 | A1 | 11/2001 |
| WO | WO 01/89006 | A1 | 11/2001 |
| WO | WO 02/26978 | A1 | 4/2002 |
| WO | WO 03/016589 | A1 | 2/2003 |
| WO | WO 03/098716 | A1 | 11/2003 |
| WO | WO 2004/006199 | A2 | 1/2004 |
| WO | WO 2004/016992 | A1 | 2/2004 |
| WO | WO 2004/070840 | A1 | 8/2004 |
| WO | WO 2004/089620 | A2 | 10/2004 |
| WO | WO 2005/015655 | A1 | 2/2005 |
| WO | WO 2005/045947 | A2 | 5/2005 |
| WO | WO 2005/048368 | A1 | 5/2005 |
| WO | WO 2006/036492 | | 4/2006 |

OTHER PUBLICATIONS

De Gryse, R. et al., "Sputtered Transparent Barrier Layers," Tenth International Conference on Vacuum Web Coating, Nov. 1996, pp. 190–198.

Shi, M.K., et al., Plasma treatment of PET and acrylic coating surfaces–I, In situ XPS measurements, Journal of Adhesion Science and Technology, Mar. 2000, 14(12), pp. 1–28.

Affinito, J.D. et al., "Vacuum Deposition of Polymer Electrolytes on Flexible Susbtrates" The Ninth International Conference on Vacuum Web Coating, 1995, pp. 0–16.

Affinito, J.D., Vacuum Deposited Conductive Polymer Films; The Eleventh International Conference on Vacuum Web Coatings, Nov. 9–11, 1997, pp. 1–13.

Affinito, J.D. et al, Ultra High Rate, Wide Area, Plasma Polymerized Films from High Molecular Weight/Low Vapor Pressure Liquid or Solid Monomer Precursors; 45$^{th}$ International Symposium of the American Vacuum Society; Nov. 2–6, 1998, pp. 0–26.

Norenberg, H. et al., Comparative Study of Oxygen Permeation Through Polymers and Gas Barrier Films, Denver, Apr. 15–20, 2000; pp. 347–351; Society of Vacuum Coaters.

Yializis, A. et al., Ultra High Barrier Films; Denver, Apr. 15–20, 2000, pp. 404–407; Society of Vacuum Coaters.

Henry, B.M. et al., Microstructural and Gas Barrier Properties of Transparent Aluminum Oxide and Indium Tin Oxide Films; Denver, Apr. 15–20, 2000; pp. 373–378; Society of Vacuum Coaters.

Tropsha et al., Combinatorial Barrier Effect of the Multilayer SiOx Coatings on Polymer Substrates; 1997 Society of Vacuum Coaters, 40$^{th}$ Annual Technical Conferences Proceedings; Apr. 12–17, 1997; pp. 64–69.

Tropsha et al., Activated Rate Theory Treatment of Oxygen and Water Transport through Silicon Oxide/Poly(ethylene terphthalate) Composite Barrier Structures; J. Phys. Chem B Mar. 1997; pp. 2259–2266.

Affinito, J.D. et al., PML/Oxide/PML Barrier Layer Performance Differences Arising From Use Of UV Or Electron Beam Polymerization Of The PML Layers, SVC 40$^{th}$ Annual Technical Conference, Apr. 12–17, 1997, 4 pages only.

Affinito, J.D. et al., Vacuum Deposited Polymer/metal Multilayer Films for Optical Applications; Paper No. C1.13; International Conference on Metallurgical Coatings; Apr. 15–21, 1995, pp. 1–14.

Felts, J.T., Transparent Barrier Coatings Update: Flexible Substrates; Society of Vacuum Coaters; 36$^{th}$ Annual Technical Conference Proceedings; Apr. 25–30, 1993; pp. 324–331.

Affinito, J.D. et al., Molecularly Doped Polymer Composite Films for Light Emitting Polymer Application Fabricated by the PML Process; 41$^{st}$ Technical Conference of the Society of Vacuum Coaters; Apr. 1998; pp. 220–225.

Affinito, J.D. et al., Polymer/polymer, Polymer/Oxide, and Polymer/Metal Vacuum Deposited Interference Filters; Tenth International Vacuum Web Coating Conference; Nov. 1996; pp. 0–14.

Mahon, J.K. et al, Requirements of Flexible Substrates for Organic Light Emitting Devices in Flat Panel Display Applications, Society of Vacuum Coaters, 42$^{nd}$ Annual Technical Conference Proceedings, Apr. 1999, pp. 456–459.

Kukla, R. et al., Transparent Barrier Coatings with EB–Evaporation, an Update; Section Five; Transparent Barrier Coating Papers; Thirteenth International Conference on Vacuum Web Coating; Oct. 17–19, 1999 pp. 222–233.

Hibino, N. et al., Transparent Barrier $Al_2O_3$ Coating By Activated Reactive Evaporation; Thirteenth International Conference on Vacuum Web Coating; Oct. 17–19, 1999; pp. 234–246.

Bright, Clark I., Transparent Barrier Coatings Based on ITO for Flexible Plastic Displays; Thirteenth International Conference on Vacuum Web Coating; Oct. 17–19, 1999; pp. 247–255.
Henry, B.M. et al., Microstructural Studies of Transparent Gas Barrier Coatings on Polymer Substrates; Thirteenth International Conference on Vacuum Web Coating; Oct. 17–19, 1999; pp. 265–273.
Affinito, J.D. et al.; Ultra High Rate, Wide Area, Plasma Polymerized Films from High Molecular Weight/Low Vapor Pressure Liquid or Liquid/Solid Suspension Monomer Precursors; MRS Conference; Nov. 29–Dec. 3, 1998; Paper No. Y12.1.
Affinito, J. D. et al., "Vacuum Deposited Conductive Polymer Films" The Eleventh International Conference on Vacuum Web Coating, no earlier than Feb. 1998, pp. 200–212.
Affinito, J. D. et al., "Molecularly Doped Polymer Composite Films for Light Emitting Polymer Applications Fabricated by the PML Process" 41st Technical Conference of Society of Vacuum Coaters, Apr. 1998, pp. 1–6.
Bunshah, R. F. et al., "Deposition Technologies for Films and Coatings" Noyes Publications, Park Ridge, New Jersey, 1982, p. 339.
Affinito, J. D., Energy Res. Abstr. 18(6), #17171, 1993.
Graupner, W. et al.; "High Resolution Color Organic Light Emitting Diode Microdisplay Fabrication Method", SPIE Proceedings; Nov. 6, 2000; pp. 1–9.
Czeremuszkin, G. et al.; Permeation Through Defects in Transparent Barrier Coated Plastic Films; 43rd Annual Technical Conference Proceedings; Apr. 15, 2000; pp. 408–413.
Vossen, J.L. et al.; Thin Film Processes; Academic Press, 1978, Part II, Chapter II–1, Glow Discharge Sputter Deposition, pp. 12–63; Part IV, Chapter IV–1 Plasma Deposition of Inorganic Compounds and Chapter IV–2 Glow Discharge Polymerization, pp. 335–397.
G. Gustafason, et al.; Flexible light–emitting diodes made from soluble conducting polymers; Letters to Nature; vol. 357; Jun. 11, 1992; pp. 477–479.
F.M. Penning; Electrical Discharges in Gases; 1965; pp. 1–51; Gordon and Breach, Science Publishers, New York–London–Paris.
Affinito, J.D., et al.; High Rate Vacuum Deposition of Polymer Electrolytes: Journal Vacuum Science Technology A 14(3), May/Jun. 1996.
Affinito, J.D. et al.; Vacuum Deposition of Polymer Electrolytes On Flexible Substrates, The Ninth International Conference on Vacuum Web Coating; pp. 20–37.
Affinito, J.D. et al.; Ultrahigh Rate, Wide Area, Plasma Polymerized Films from High Molecular Weight/Low Vapor Pressure Liquid or Solid Monomer Precursors; Journal Vacuum Science Technology A 17(4); Jul./Aug. 1999; pp. 1974–1981; American Vacuum Society.
Shi, M.K. et al.; In situ and real–time monitoring of plasma–induced etching PET and acrylic films, Plasmas and Polymers; Dec. 1999, 494); pp. 1–25.
Affinito, J.D. et al.; Molecularly Doped Polymer Composit Films for Light Emitting Polymer Application Fabricated by the PML Process; 41st Technical Conference of the Society of Vacuum Coaters; 1998; pp. 220–225.
Affinito, J.D. et al.; Vacuum Deposited Polymer/Metal Multilayer Films for Optical Application; Thin Solid Films 270, 1995; pp. 43–48.
Felts, J.T.; Transparent Barrier Coatings Update: Flexible Substrates; pp. 324–331.
Phillips, R.W.; Evaporated Dielectric Colorless Films on PET and Opp Exhibiting High Barriers Toward Moisture and Oxygen; Society of Vacuum Coaters; 36th Annual Technical Conference Proceedings; 1993; pp. 293–300.
Yamada, Y. et al.; The Properties of a New Transparent and Colorless Barrier Film; 1995; pp. 28–31; Society of Vacuum Coaters.
Chahroudi, D.; Transparent Glass Barrier Coatings for Flexible Film Packaging; 1991; pp. 130–133; Society of Vacuum Coaters.
Krug, T. et al.; New Developments in Transparent Barrier Coatings; 1993; pp. 302–305; Society Vacuum Coaters.
Affinito, J.D. et al.; PML/Oxide/PML Barrier Layer Performance Differences Arising From Use Of UV or Electron Beam Polymerization of the PML Layers; Thin Solid Films; Elsevier Science S.A.; vol. 308–309; Oct. 31, 1997; pp. 19–25.
Affinito, J.D. et al.; A new method for fabricating transparent barrier layers, Thin Solid Films 290–291; 1996; pp. 63–67.
Affinito, J.D. et al.; Polymer–Oxide Transparent Barrier Layers; SVC 39th Annual Technical Conference; Vacuum Web Coating Session; 1996; pp. 392–397.
Hoffmann, G. et al.; Transparent Barrier Coatings by Reactive Evaporation; 1994; pp. 155–160; Society of Vacuum Coaters.
Klemberg–Sapieha, J.E. et al.; Transparent Gas Barrier Coatings Produced by Dual–Frequency PECVD; 1993; pp. 445–449; Society of Vacuum Coaters.
Finson, E. et al.; Transparent SiO2 Barrier Coatings: Conversion and Production Status; 1994; pp. 139–143; Society of Vacuum Coaters.
Yializis, A. et al.; High Oxygen Barrier Polypropylene Films Using Transparent Acrylate–A2O3 and Opaque Al–Acrylate Coatings; 1995; pp. 95–102; Society of Vacuum Coaters.
Shaw, D.G. et al.; Use of Vapor Deposited Acrylate Coatings to Improve the Barrier Properties of Metallized Film; 1994; pp. 240–244; Society of Vacuum Coaters.
Clark I. Bright, et al., Transparent Barrier Coatings Based on ITO for Flexible Plastic Displays, Oct. 17–19, 1999, pp. 247–264, Tucson, Arizona.
Notification of Transmittal of the International Search Report Or The Declaration, Mar. 3, 2000, PCT/US99/29853.*

* cited by examiner

ULTRABARRIER SUBSTRATES

Matter enclosed in heavy brackets [ ] appears in the original patent but forms no part of this reissue specification; matter printed in italics indicates the additions made by reissue.

*This application is a continuation-in-part of U.S. patent application Ser. No. 09/427,138, filed Oct. 25, 1999, entitled "Environmental Barrier Material For Organic Light Emitting Device and Method Of Making," now U.S. Pat. No. 6,522,067, issued Feb. 18, 2003.*

BACKGROUND OF THE INVENTION

The present invention relates generally to barrier coatings, and more particularly to barrier coatings having improved barrier properties.

Many different types of products are sensitive to gas and liquids, which can cause deterioration of the product or render it useless, including electronics, medical devices, and pharmaceuticals. Barrier coatings have been included in the packaging for these environmentally sensitive products to protect them from gas and liquid transmission. As used herein, the term environmentally sensitive means products which are subject to degradation caused by permeation of environmental gases or liquids, such as oxygen and water vapor in the atmosphere or chemicals used in the processing, handling, storage, and use of the product.

Plastics are often used in product packaging. However, the gas and liquid permeation resistance of plastics is poor, often several orders of magnitude below what is required for product performance. For example, the oxygen transmission rates for materials such polyethylene terephthalate (PET) are as high as 1550 cc/m$^2$/day/micron of thickness (or 8.7 cc/m$^2$/day for 7 mil thickness PET), and the water vapor transmission rates are also in this range. Certain display applications using environmentally sensitive display devices, such as organic light emitting devices, require encapsulation that has a maximum oxygen transmission rate of $10^{-4}$ to $10^{-2}$ cc/m$^2$/day, and a maximum water vapor transmission rate of $10^{-5}$ to $10^{-6}$ g/m$^2$/day.

Barrier coatings have been applied to plastic substrates to decrease their gas and liquid permeability. Barrier coatings typically consist of single layer thin film inorganic materials, such as Al, $SiO_x$, $AlO_x$, an $Si_3N_4$ vacuum deposited on polymeric substrates. A single layer coating on PET reduces oxygen permeability to levels of about 0.1 to 1.0 cc/m$^2$/day, and water vapor permeability to about 0.1 to 1.0 g/m$^2$/day, which is insufficient for many display devices.

Barrier coatings which include alternating barrier layers and polymeric layers have been developed. For example, U.S. Pat. Nos. 5,607,789 and 5,681,666 disclose a moisture barrier for an electrochemical cell tester. However, the claimed moisture barrier ranges from 2 to 15 micrograms/in$^2$/day which corresponds to a rate of 0.003 to 0.023 g/m$^2$/day. U.S. Pat. No. 5,725,909 to Shaw et al. discloses a coating for packaging materials which has an acrylate layer and an oxygen barrier layer. The oxygen transmission rate for the coating was reported to be 0.1 cc/m$^2$/day at 23° C. and the water vapor transmission rate was reported to be 0.01 g/m$^2$/day in D. G. Shaw and M. G. Langlois, Society of Vacuum Coaters, 37$^{th}$ Annual Technical Conference Proceedings, p. 240–244, 1994. The oxygen transmission rates for these coatings are inadequate for many display devices.

Thus, there is a need for an improved, lightweight, barrier coating, and for methods for making such a barrier coating.

SUMMARY OF THE INVENTION

The present invention meets these needs by providing a barrier assembly and a method for making such an assembly. The barrier assembly includes at least one barrier stack having at least one barrier layer and at least one polymer layer. The barrier stack has an oxygen transmission rate of less than 0.005 cc/m$^2$/day at 23° C. and 0% relative humidity, and an oxygen transmission rate of less than 0.005 cc/m$^2$/day at 38° C. and 90% relative humidity. It also preferably has a water vapor transmission rate of less than 0.005 g/m$^2$/day at 38° C. and 100% relative humidity.

Preferably, the barrier layers of the barrier stacks are substantially transparent. At least one of the barrier layers preferably comprises a material selected from metal oxides, metal nitrides, metal carbides, metal oxynitrides, metal oxyborides, and combinations thereof.

The barrier layers can be substantially opaque, if desired. The opaque barrier layers are preferably selected from opaque metals, opaque polymers, and opaque ceramics.

The barrier assembly can include a substrate adjacent to the at least one barrier stack. By adjacent, we mean next to, but not necessarily directly next to. There can be additional layers intervening between the adjacent layers. The substrate can either be flexible or rigid. It is preferably made of a flexible substrate material, such as polymers, metals, paper, fabric, and combinations thereof. If a rigid substrate is used, it is preferably a ceramic (including glasses), a metal, or a semiconductor.

The polymer layers of the barrier stacks are preferably acrylate-containing polymers. As used herein, the term acrylate-containing polymers includes acrylate-containing polymers, methacrylate-containing polymers, and combinations thereof The polymer layers can be the same or different.

The barrier assembly can include additional layers if desired, such as polymer smoothing layers, scratch resistant layers, antireflective coatings, or other functional layers.

The present invention also involves a method of making the barrier assembly. The method includes providing a substrate, and placing at least one barrier stack on the substrate. The barrier stack includes at least one barrier layer and at least one polymer layer.

The at least one barrier stack can be placed on the substrate by deposition, preferably vacuum deposition, or by laminating the barrier stack over the environmentally sensitive device. The lamination can be performed using an adhesive, solder, ultrasonic welding, pressure, or heat.

Accordingly, it is an object of the present invention to provide a barrier assembly, and to provide a method of making such a barrier assembly.

DESCRIPTION OF THE INVENTION

Figure 1:
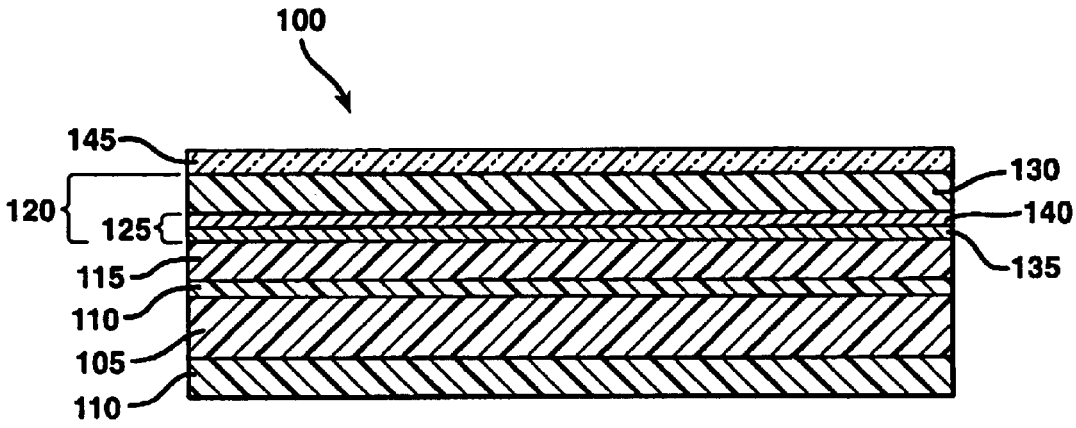
FIG. 1 is a cross-section of one embodiment of the barrier assembly of the present invention.

One embodiment of the barrier assembly of the present invention is shown in FIG. 1. The barrier assembly is supported by a substrate 105. The substrate 105 can be either rigid or flexible. A flexible substrate can be any flexible material, including, but not limited to: polymers, for example, polyethylene terephthalate (PET), polyethylene naphthalate (PEN), or high temperature polymers, such as polyether sulfone (PES), polyimides, or Transphan™ (a high glass transition temperature cyclic olefin polymer available from Lofo High Tech Film, GMBH or Weil am Rhein, Germany); metal; paper; fabric; and combinations thereof. Rigid substrates are preferably glass, metal, or silicon.

There are scratch resistant layers 110 on either side of the substrate 105 to protect it. When a scratch resistant layer is included, it is preferred that both sides of the substrate have a scratch resistant layer. This helps to balance stresses and prevent deformation of a flexible substrate during processing and use.

On top of the scratch resistant layer 110, there is a polymer smoothing layer 115. The polymer smoothing layer decreases surface roughness, and encapsulates surface defects, such as pits, scratches, and digs. This produces a planarized surface which is ideal for subsequent deposition of layers. Depending on the desired application, there can be additional layers deposited on the substrate 105, such as organic or inorganic layers, planarizing layers, electrode layers, antireflective coatings, and other functional layers. In this way, the substrate can be specifically tailored to different applications.

The first barrier stack 120 is adjacent to the polymer smoothing layer 115. The first barrier stack 120 includes a barrier layer 125 and a polymer layer 130. The first barrier layer 125 includes barrier layers 135 and 140. Barrier layers 135 and 140 can be made of the same barrier material or of different barrier materials.

Although FIG. 1 shows a barrier stack with two barrier layers and one polymer layer, the barrier stacks can have one or more polymer layers and one or more barrier layers. There could be one polymer layer and one barrier layer, there could be one or more polymer layers on one side of one or more barrier layers, or there could be one or more polymer layers on both sides of one or more barrier layers. The important feature is that the barrier stack have at least one polymer layer and at least one barrier layer. The barrier layers and polymer layers in the barrier stack can be made of the same material or of a different material. The barrier layers are typically about 100–400 Å thick, and the polymer layers are typically about 1000–10,000 Å thick.

Although only one barrier stack is shown in FIG. 1, the number of barrier stacks is not limited. The number of barrier stacks needed depends on the substrate material used and the level of permeation resistance needed for the particular application. One or two barrier stacks should provide sufficient barrier properties for some applications. The most stringent applications may require five or more barrier stacks.

There is a transparent conductor 145, such as an indium tin oxide layer, adjacent to the first barrier stack 120. There can be additional overcoat layers on top of the barrier stack, such as organic or inorganic layers, planarizing layers, transparent conductors, antireflective coatings, or other functional layers, if desired. This allows the barrier assembly to be tailored to the application.

Figure 2:
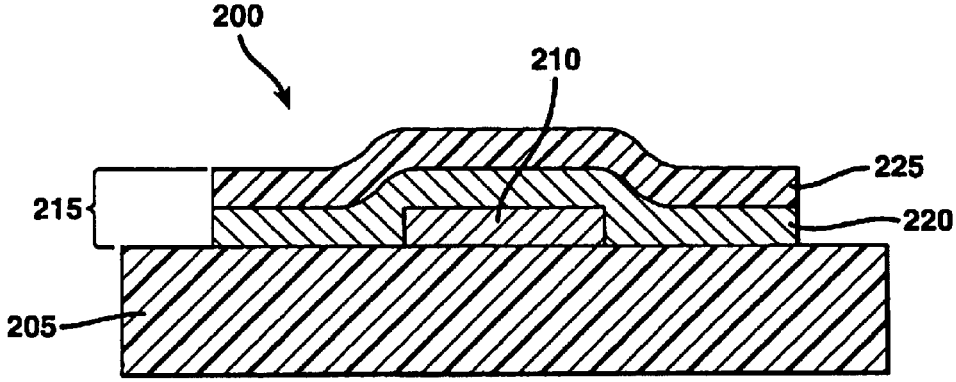
FIG. 2 is a cross-section of an encapsulated device made using the barrier assembly of the present invention.

FIG. 2 shows a barrier assembly being used to encapsulate an environmentally sensitive display device. The substrate 205 has an environmentally sensitive display device 210 on it. There is a barrier stack 215 over the environmentally sensitive display device 210 encapsulating it. The barrier stack 215 includes a barrier layer 220 and a polymer layer 225.

The environmentally sensitive display device 210 can be any display device which is environmentally sensitive. Examples of environmentally sensitive display devices include, but are not limited to liquid crystal displays (LCDs), light emitting diodes (LEDs), light emitting polymers (LEPs), electronic signage using electrophoretic inks, electroluminescent devices (EDs), and phosphorescent devices. These display devices can be made using known techniques, such as those described in U.S. Pat. Nos. 6,025,899, 5,995,191, 5,994,174, 5,956,112 (LCDs); U.S. Pat. Nos. 6,005,692, 5,821,688, 5,747,928 (LEDs); U.S. Pat. Nos. 5,969,711, 5,961,804, 4,026,713 (E Ink); U.S. Pat. Nos. 6,023,373, 6,023,124, 6,023,125 (LEPs); and U.S. Pat. Nos. 6,023,073, 6,040,812, 6,019,654, 6,018,237, 6,014,119, 6,010,796 (EDs), which are incorporated herein by reference.

The method of making the barrier assembly will be described with reference to FIGS. 1 and 2. Any initial layers which are desired, such as scratch resistant layers, planarizing layers, electrically conductive layers, etc., can be coated, deposited, or otherwise placed on the substrate. A polymer smoothing layer is preferably included to provide a smooth base for the remaining layers. It can be formed by depositing a layer of polymer, for example, an acrylate-containing polymer, onto the substrate or previous layer. The polymer layer can be deposited in vacuum or by using atmospheric processes such as spin coating and/or spraying. Preferably, an acrylate-containing monomer, oligomer, or resin is deposited and then polymerized in situ to form the polymer layer. As used herein, the term acrylate-containing monomer, oligomer, or resin includes acrylate-containing monomers, oligomers, and resins, methacrylate-containing monomers, oligomers, and resins, and combinations thereof.

The barrier stack is then placed on the substrate. The barrier stack includes at least one barrier layer and at least one polymer layer. The barrier stacks are preferably made by vacuum deposition. The barrier layer can be vacuum deposited onto the polymer smoothing layer, the substrate, or the previous layer. The polymer layer is then deposited on the barrier layer, preferably by flash evaporating acrylate-containing monomers, oligomers, or resins, condensing on the barrier layer, and polymerizing in situ in a vacuum chamber. U.S. Pat. Nos. 5,440,446 and 5,725,909, which are incorporated herein by reference, describe methods of depositing thin film, barrier stacks.

Vacuum deposition includes flash evaporation of acrylate-containing monomer, oligomer, or resin with in situ polymerization under vacuum, plasma deposition and polymerization of acrylate-containing monomer, oligomer, or resin, as well as vacuum deposition of the barrier layers by sputtering, chemical vapor deposition, plasma enhanced chemical vapor deposition, evaporation, sublimation, electron cyclotron resonance-plasma enhanced vapor deposition (ECR-PECVD), and combinations thereof.

In order to protect the integrity of the barrier layer, the formation of defects and/or microcracks in the deposited layer subsequent to deposition and prior to downstream processing should be avoided. The barrier assembly is preferably manufactured so that the barrier layers are not directly contacted by any equipment, such as rollers in a web coating system, to avoid defects that may be caused by abrasion over a roll or roller. This can be accomplished by designing the deposition system such that the barrier layers are always covered by polymer layers prior to contacting or touching any handling equipment.

When the barrier stack is being used to encapsulate an environmentally sensitive display device, the substrate can be prepared as described above, and the environmentally sensitive display device placed on the substrate. Alternatively, the environmentally sensitive display device can be placed directly on a substrate (or on a substrate with functional layers, such as planarizing layers, scratch resistant layers, etc.).

The environmentally sensitive display device can be placed on the substrate by deposition, such as vacuum deposition. Alternatively it can be placed on the substrate by lamination. The lamination can use an adhesive, glue, or the like, or heat to seal the environmentally sensitive display device to the substrate.

A barrier stack is then placed over the environmentally sensitive display device to encapsulate it. The second barrier stack can be placed over the environmentally sensitive display device by deposition or lamination.

The barrier layers in the first and second barrier stacks may be any barrier material. The barrier layers in the first and second barrier stacks can be made of the same material or a different material. In addition, multiple barrier layers of the same or different barrier materials can be used in a barrier stack.

The barrier layers can be transparent or opaque, depending on the design of the packaging, and application for which it is to be used. Preferred transparent barrier materials include, but are not limited to, metal oxides, metal nitrides, metal carbides, metal oxynitrides, metal oxyborides, and combinations thereof. The metal oxides are preferably selected from silicon oxide, aluminum oxide, titanium oxide, indium oxide, tin oxide, indium tin oxide, tantalum oxide, zirconium oxide, niobium oxide, and combinations thereof. The metal nitrides are preferably selected from aluminum nitride, silicon nitride, boron nitride, and combinations thereof. The metal oxynitrides are preferably selected from aluminum oxynitride, silicon oxynitride, boron oxynitride, and combinations thereof.

Opaque barrier layers can be also be used in some barrier stacks. Opaque barrier materials include, but are not limited to, metals, ceramics, polymers, and cermets. Examples of opaque cermets include, but are not limited to, zirconium nitride, titanium nitride, hafnium nitride, tantalum nitride, niobium nitride, tungsten disilicide, titanium diboride, and zirconium diboride.

The polymer layers of the first and second barrier stacks are preferably acrylate-containing monomers, oligomers, or resins. The polymer layers in the first and second barrier stacks can be the same or different. In addition, the polymer layers within each barrier stack can be the same or different.

In a preferred embodiment, the barrier stack includes a polymer layer and two barrier layers. The two barrier layers can be made from the same barrier material or from different barrier materials. The thickness of each barrier layer in this embodiment is about one half the thickness of the single barrier layer, or about 50 to 200 Å. There are no limitations on the thickness, however.

When the barrier layers are made of the same material, they can be deposited either by sequential deposition using two sources or by the same source using two passes. If two deposition sources are used, deposition conditions can be different for each source, leading to differences in microstructure and defect dimensions. Any type of deposition source can be used. Different types of deposition processes, such as magnetron sputtering and electron beam evaporation, can be used to deposit the two barrier layers.

The microstructures of the two barrier layers are mismatched as a result of the differing deposition sources/parameters. The barrier layers can even have different crystal structure. For example, $Al_2O_3$ can exist in different phases (alpha, gamma) with different crystal orientations. The mismatched microstructure can help decouple defects in the adjacent barrier layers, enhancing the tortuous path for gases and water vapor permeation.

When the barrier layers are made of different materials, two deposition sources are needed. This can be accomplished by a variety of techniques. For example, if the materials are deposited by sputtering, sputtering targets of different compositions could be used to obtain thin films of different compositions. Alternatively, two sputtering targets of the same composition could be used but with different reactive gases. Two different types of deposition sources could also be used. In this arrangement, the lattices of the two layers are even more mismatched by the different microstructures and lattice parameters of the two materials.

A single pass, roll-to-roll, vacuum deposition of a three layer combination on a PET substrate, i.e., PET substrate/polymer layer/barrier layer/polymer layer, can be more than five orders of magnitude less permeable to oxygen and water vapor than a single oxide layer on PET alone. See J. D. Afinito, M. E. Gross, C. A. Coronado, G. L. Graff, E. N. Greenwell, and P. M. Martin, Polymer-Oxide Transparent Barrier Layers Produced Using PML Process, 39$^{th}$ Annual Technical Conference Proceedings of the Society of Vacuum Coaters, Vacuum Web Coating Session, 1996, pages 392–397; J. D. Affinito, S. Eufinger, M. E. Gross, G. L. Graff, and P. M. Martin, PML/Oxide/PML Barrier Layer Performance Difference Arising From Use of UV or Electron Beam Polymerization of the PML Layers, Thin Solid Films, Vol. 308, 1997, pages 19–25. This is in spite of the fact that the effect on the permeation rate of the polymer multilayers (PML) layers alone, without the barrier layer (oxide, metal, nitride, oxynitride) layer, is barely measurable. It is believed that the improvement in barrier properties is due to two factors. First, permeation rates in the roll-to-roll coated oxide-only layers were found to be conductance limited by defects in the oxide layer that arose during deposition and when the coated substrate was wound up over system idlers/rollers. Asperities (high points) in the underlying substrate are replicated in the deposited inorganic barrier layer. These features are subject to mechanical damage during web handling/take-up, and can lead to the formation of defects in the deposited film. These defects seriously limit the ultimate barrier performance of the films. In the single pass, polymer/barrier/polymer process, the first acrylic layer planarizes the substrate and provides an ideal surface for subsequent deposition of the inorganic barrier thin film. The second polymer layer provides a robust "protective" film that minimizes damage to the barrier layer and also planarizes the structure for subsequent barrier layer (or environmentally sensitive display device) deposition. The intermediate polymer layers also decouple defects that exist in adjacent inorganic barrier layers, thus creating a tortuous path for gas diffusion.

The permeability of the barrier stacks used in the present invention is shown in Table 1. The barrier stacks of the present invention on polymeric substrates, such as PET, have measured oxygen transmission rate (OTR) and water vapor transmission rate (WVTR) values well below the detection limits of current industrial instrumentation used for permeation measurements (Mocon OxTran 2/20L and Permatran). Table 1 shows the OTR and WVTR values (measured according to ASTM F 1927-98 and ASTM F 1249-90, respectively) measured at Mocon (Minneapolis, Minn.) for several barrier stacks on 7 mil PET, along with reported values for other materials.

TABLE 1

| Sample | Oxygen Permeation Rate ($cc/m^2/day$) | | Water Vapor Permeation ($g/m^2/day$)* | |
|---|---|---|---|---|
| | 23° C. | 38° C. | 23° C. | 38° C. |
| Native 7 mil PET | 7.62 | — | — | — |
| 1-barrier stack | <0.005 | <0.005* | — | 0.46* |
| 1-barrier stack with ITO | <0.005 | <0.005* | — | 0.011* |
| 2-barrier stacks | <0.005 | <0.005* | — | <0.005* |
| 2-barrier stacks with ITO | <0.005 | <0.005* | — | <0.005* |
| 5-barrier stacks | <0.005 | <0.005* | — | <0.005* |
| 5-barrier stacks with ITO | <0.005 | <0.005* | — | <0.005* |
| DuPont film[1] ($PET/Si_3N_4$ or $PEN/Si_3N_4$) | 0.3 | — | — | — |
| Polaroid[3] | <1.0 | — | — | — |
| PET/Al[2] | 0.6 | — | 0.17 | — |
| PET/silicon oxide[2] | 0.7-1.5 | — | 0.15-0.9 | — |
| Teijin LCD film (HA grade-TN/STN)[3] | <2 | — | <5 | — |

*38° C., 90% RH, 100% $O_2$
*38° C., 100% RH
[1]P. F. Carcia, 46th International Symposium of the American Vacuum Society, October 1999
[2]Langowski, H. C., 39th Annual Technical Conference Proceedings, SVC, pp. 398-401 (1996)
[3]Technical Data Sheet As the data in Table 1 shows, the barrier stacks of the present invention provide oxygen and water vapor permeation rates several orders of magnitude better than PET coated with aluminum, silicon oxide, or aluminum oxide. Typical oxygen permeation rates for other barrier coatings range from 1 to about 0.1 $cc/m^2/day$. The oxygen transmission rate for the barrier stacks of the present invention is less than 0.005 $cc/m^2/day$ at 23° C. and 0% relative humidity, and at 38° C. and 90% relative humidity. The water vapor transmission rate is less than 0.005 $g/m^2/day$ at 38° C. and 100% relative humidity. The actual transmission rates are lower, but cannot be measured with existing equipment.

The barrier assemblies were also tested by encapsulating organic light emitting devices using the barrier stacks of the present invention. The organic light emitting devices are extremely sensitive to water vapor, and they are completely destroyed in the presence of micromole quantities of water vapor. Experimentation and calculations suggest that the water vapor transmission rate through the encapsulation film must be on the order of about $10^{-6}$ to $10^{-5}$ $g/m^2/day$ to provide sufficient barrier protection for acceptable device lifetimes. The experiments/calculations are based on the detrimental hydrolysis reaction of water vapor with the extremely thin (less than 10 nm), low work function, cathode materials (Ca, Mg, Li, LiF). Hydrolysis of the cathode leads to the formation of non-conductive reaction products (such as hydroxides and oxides) that delaminate or blister away from the electron transport layers of the organic light emitting devices, resulting in the formation of dark spots on the device.

The organic light emitting devices encapsulated in the barrier stacks of the present invention have been in operation for over six months and without measurable degradation. The extrapolated lifetime for the encapsulated devices exceeds the required 10,000 hours necessary to satisfy industry standards. The barrier stacks are extremely effective in preventing oxygen and water penetration to the underlying components, substantially outperforming other thin-film barrier coatings on the market.

The preferred deposition process is compatible with a wide variety of substrates. Because the preferred process involves flash evaporation of a monomer and magnetron sputtering, deposition temperatures are well below 100° C., and stresses in the coating can be minimized. Multilayer coatings can be deposited at high deposition rates. No harsh gases or chemicals are used, and the process can be scaled up to large substrates and wide webs. The barrier properties of the coating can be tailored to the application by controlling the number of layers, the materials, and the layer design. Thus, the present invention provides a barrier stack with the exceptional barrier properties necessary for hermetic sealing of an environmentally sensitive display device, or other environmentally sensitive device. It permits the production of an encapsulated environmentally sensitive display device.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A barrier assembly comprising:

at least one barrier stack comprising at least one barrier layer and at least one polymer layer, wherein the at least one barrier stack has an oxygen transmission rate of less than 0.005 $cc/m^2/day$ at 23° C. and 0% relative humidity.

2. The barrier assembly of claim 1 wherein the at least one barrier stack has an oxygen transmission rate of less than 0.005 $cc/m^2/day$ at 38° C. and 90% relative humidity.

3. The barrier assembly of claim 1 wherein the at least one barrier stack has a water vapor transmission rate of less than 0.005 $g/m^2/day$ at 38° C. and 100% relative humidity.

4. The barrier assembly of claim 1 further comprising a substrate adjacent to the at least one barrier stack.

5. The barrier assembly of claim 1 wherein the at least one barrier layer is substantially transparent.

6. The barrier assembly of claim 1 wherein at least one of the at least one barrier layer comprises a material selected from metal oxides, metal nitrides, metal carbides, metal oxynitrides, metal oxyborides, and combinations thereof.

7. The barrier assembly of claim 6 wherein the metal oxides are selected from silicon oxide, aluminum oxide, titanium oxide, indium oxide, tin oxide, indium tin oxide, tantalum oxide, zirconium oxide, niobium oxide, and combinations thereof.

8. The barrier assembly of claim 6 wherein the metal nitrides are selected from aluminum nitride, silicon nitride, boron nitride, and combinations thereof.

9. The barrier assembly of claim 6 wherein the metal oxynitrides are selected from aluminum oxynitride, silicon oxynitride, boron oxynitride, and combinations thereof.

10. The barrier assembly of claim 1 wherein the at least one barrier layer is substantially opaque.

11. The barrier assembly of claim 1 wherein at least one of the at least one barrier layers is selected from opaque metals, opaque polymers, opaque ceramics, and opaque cermets.

12. The barrier assembly of claim 4 wherein the substrate comprises a flexible substrate material.

13. The barrier assembly of claim 12 wherein the flexible substrate material is selected from polymers, metals, paper, fabric, and combinations thereof.

14. The barrier assembly of claim 4 wherein the substrate comprises a rigid substrate material.

15. The barrier assembly of claim 14 wherein the rigid substrate material is selected from ceramics, metals, and semiconductors.

16. The barrier assembly of claim 1 wherein at least one of the at least one polymer layers comprises an acrylate-containing polymer.

17. The barrier assembly of claim 4 further comprising a polymer smoothing layer adjacent to the substrate.

18. The barrier assembly of claim 4 further comprising a scratch resistant layer adjacent to the substrate.

19. The barrier assembly of claim 4 further comprising an anti-reflective coating adjacent to the substrate.

20. The barrier assembly of claim 4 further comprising an anti-fingerprint coating adjacent to the substrate.

21. The barrier assembly of claim 4 further comprising an anti-static coating adjacent to the substrate.

22. The barrier assembly of claim 1 wherein the at least one barrier layer comprises two barrier layers.

23. The barrier assembly of claim 22 wherein the two barrier layers are made of the same barrier material.

24. The barrier assembly of claim 22 wherein the two barrier layers are made of different barrier materials.

25. The barrier assembly of claim 11 wherein at least one of the at least one barrier layers is opaque cermet selected from zirconium nitride, titanium nitride, hafnium nitride, tantalum nitride, niobium nitride, tungsten disilicide, titanium diboride, and zirconium diboride.

* * * * *